United States Patent
Young et al.

(10) Patent No.: US 7,928,316 B2
(45) Date of Patent: Apr. 19, 2011

(54) SOLAR CONCENTRATOR BACKPAN

(75) Inventors: Peter Young, San Francisco, CA (US);
Stephen J. Horne, El Granada, CA (US); Gary D. Conley, Saratoga, CA (US); Martin Vasquez, Campbell, CA (US)

(73) Assignee: SolFocus, Inc., Mountain View, CA (US)

( * ) Notice: Subject to any disclaimer, the term of this patent is extended or adjusted under 35 U.S.C. 154(b) by 394 days.

(21) Appl. No.: 12/134,172

(22) Filed: Jun. 5, 2008

(65) Prior Publication Data
US 2009/0301545 A1   Dec. 10, 2009

(51) Int. Cl.
*H02N 6/00* (2006.01)
*H01L 31/042* (2006.01)

(52) U.S. Cl. ............ 136/251; 136/246; 136/244

(58) Field of Classification Search ........... 136/246, 136/244, 251
See application file for complete search history.

(56) References Cited

U.S. PATENT DOCUMENTS

| | | | | |
|---|---|---|---|---|
| 4,097,308 A | * | 6/1978 | Klein et al. | 136/251 |
| 4,150,663 A | | 4/1979 | Sisson | |
| 4,235,643 A | * | 11/1980 | Amick | 136/246 |
| 4,337,758 A | * | 7/1982 | Meinel et al. | 126/684 |
| 4,834,805 A | * | 5/1989 | Erbert | 136/246 |
| 5,062,899 A | | 11/1991 | Kruer | |
| 6,034,319 A | | 3/2000 | Falbel | |
| 2004/0134531 A1 | * | 7/2004 | Habraken et al. | 136/246 |
| 2006/0054211 A1 | | 3/2006 | Meyers | |
| 2006/0266408 A1 | | 11/2006 | Horne | |
| 2008/0047605 A1 | | 2/2008 | Benitez et al. | |
| 2008/0135087 A1 | * | 6/2008 | Anikara | 136/246 |

FOREIGN PATENT DOCUMENTS

| | | | |
|---|---|---|---|
| JP | 2006-303494 A | | 11/2006 |
| WO | WO2006030433 | * | 3/2006 |

* cited by examiner

*Primary Examiner* — Jeffrey T Barton
*Assistant Examiner* — Allison Bourke
(74) *Attorney, Agent, or Firm* — The Mueller Law Office, P.C.

(57) ABSTRACT

The present invention is a contoured backpan for a solar concentrator array. The backpan has depressions integrally formed in its bottom surface for seating solar concentrator modules. The depressions, in combination connecting toughs, provide a structure which is able to support an array of solar concentrators. Optional stiffening members may be attached to fee backpan to provide additional structural rigidity, as well as to support a front panel for the array.

16 Claims, 3 Drawing Sheets

SOLAR CONCENTRATOR BACKPAN

BACKGROUND OF THE INVENTION

Solar concentrators are solar energy generators which increase the efficiency of converting solar energy into DC electricity. Solar concentrators known in the art utilize, for example, parabolic mirrors and Fresnel lenses for focusing incoming solar energy, and heliostats for tracking the sun's movements in order to maximize light exposure. Another type of solar concentrator, disclosed in U.S. Patent Publication No. 2006/0266408, entitled "Concentrator Solar Photovoltaic Array with Compact Tailored Imaging Power Units," utilizes a front panel for allowing solar energy to enter the assembly, with a primary mirror and a secondary mirror to reflect and focus solar energy through a non-imaging concentrator onto a solar cell. The surface area of the solar cell in such a concentrator system is much smaller than what is required for non-concentrating systems, for example less than 1% of the entry window surface area. Such a system has a high efficiency in converting solar energy to electricity due to the focused intensity of sunlight, and also reduces cost due to the decreased surface area of costly photovoltaic cells.

A similar type of solar concentrator is disclosed in U.S. Patent Publication No. 2006/0207650, entitled "Multi-Junction Solar Cells with an Aplanatic Imaging System and Coupled Non-Imaging Light Concentrator." The solar concentrator design disclosed in this application uses a solid optic, out of which a primary mirror is formed on its bottom surface and a secondary mirror is formed in its upper surface. Solar radiation enters the upper surface of the solid optic, reflects from the primary mirror surface to the secondary mirror surface, and then enters a non-imaging concentrator which outputs the light onto a photovoltaic solar cell.

Solar concentrators of this type and others are typically assembled into arrays for producing energy at commercial levels. An array may be housed in an enclosure, which serves to protect the solar concentrator modules from environmental conditions and to provide structural support for transporting and mounting the array. Enclosures for solar concentrator arrays generally come in the form of a flat-bottomed back panel to hold the components of the array, with a glass front sheet covering the top for transmitting light and completing the enclosure. Because such box-type back panels, or "backpans," provide a simple design which is easy to manufacture, there is little motivation to stray from their use. Standard flat backpans are cost-effective, provide adequate structural support, and offer sufficient weather resistance for a solar concentrator array. Yet, there exists an undeveloped opportunity to create a backpan which not only provides structural support and protection, but that also provides functional and manufacturing advantages to the operation of a solar concentrator array.

SUMMARY OF THE INVENTION

The present invention is a contoured backpan for a solar concentrator array. The backpan has depressions integrally formed in its bottom surface for seating solar concentrator modules. The depressions, in combination with connecting troughs, provide a one-piece structure which is able to support an array of solar concentrators. Optional stiffening members may be attached to the backpan to provide additional structural rigidity, as well as to support a front panel over the array. In one embodiment, the backpan has circular depressions and may be used as a heat sink for the solar concentrator array.

BRIEF DESCRIPTION OF THE DRAWINGS

Reference now will be made in detail to embodiments of the disclosed invention, one or more examples of which are illustrated in the accompanying drawings wherein.

DETAILED DESCRIPTION OF THE EMBODIMENTS

Figure 1:
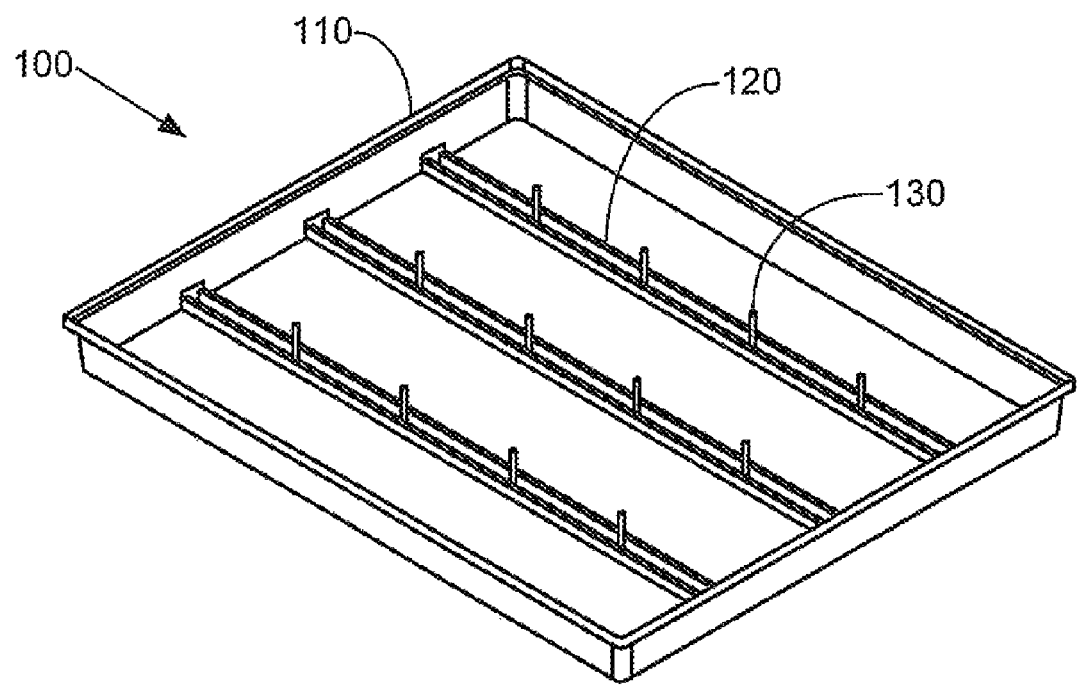
FIG. 1 is a perspective view of an exemplary flat backpan known in the art.

FIG. 1 depicts a general flat-bottomed backpan assembly 100 which is known in the art for enclosing a solar concentrator array. Backpan assembly 100 includes a flat backpan 110, crossbars 120, and optional spacing rods 130. In use, an array of solar concentrator modules is mounted into backpan assembly 100, and a front glass panel is laid over the array and the backpan 110 to enclose the array. The flat-bottomed design of backpan 110 is easy to manufacture and is therefore inexpensive. The flat surface also allows flexibility in accommodating various solar concentrator layouts and designs, simply by altering locations of mounting holes with minimal tooling changes.

Minimizing the weight of a backpan provides various benefits, including material cost and handling issues. The larger the size of an array, such as on the order of one square meter of more, the more the weight of backpan 110 becomes a significant factor in its design. While a lightweight metal such as aluminum may be used to limit the weight of backpan 110, such metals may not offer enough strength to support an entire array of solar modules. To improve the structural integrity of backpan assembly 100, crossbars 120 of a higher strength metal, such as steel, are utilized. Since crossbars 120 are of a different metal than backpan 110, fasteners or other mechanical means must be used to attach crossbars 120 to backpan 110. Thus, the minimal number of components required for backpan assembly 100 includes the backpan 110, multiple crossbars 120, and numerous fasteners. Optional spacing rods 130, which can be inserted to help support the weight of a front panel, add even more components to backpan assembly 100.

Figure 2:
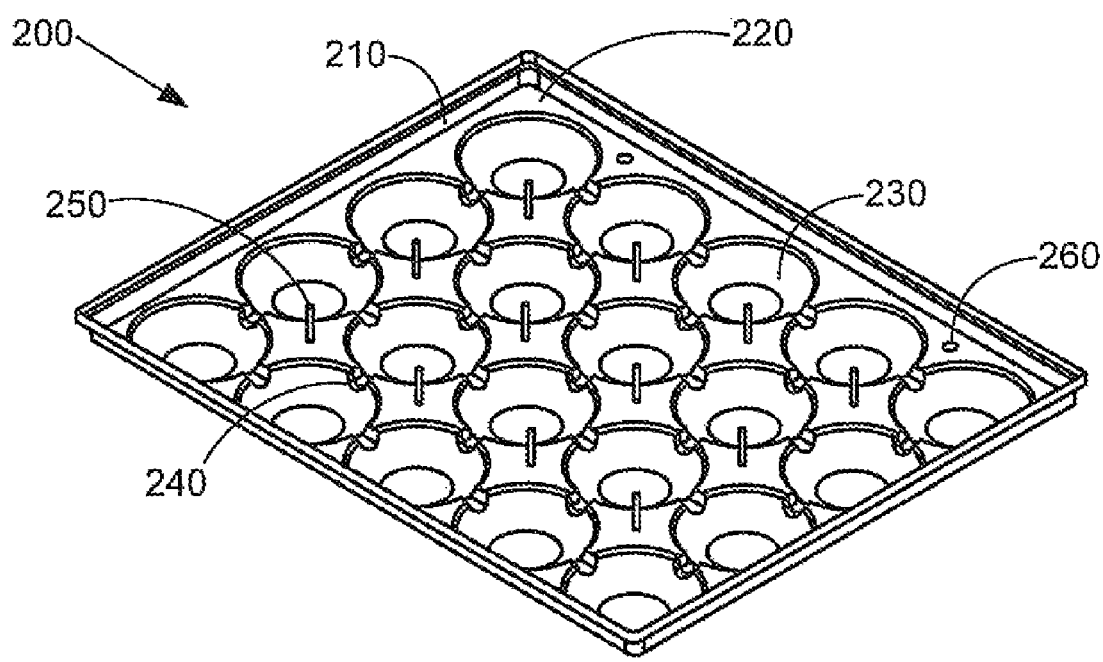
FIG. 2 depicts an exemplary embodiment of a backpan of the present invention.

An embodiment of a contoured backpan 200 of the present invention is illustrated in the perspective view of FIG. 2. Backpan 200 has side walls 210, a bottom surface 220, depressions 230 integrally formed in bottom surface 220, and troughs 240 connecting adjacent depressions 230. Optional spacing rods 250 may be added to support a front panel, not shown, and optional mounting holes 260 may be added to facilitate installation of a completed solar concentrator array onto a tracking system or other mounting surface. Ventilation ports may also be added if desired. The material for backpan 200 may be, for example, aluminum, steel, brass, copper, fiberglass, or graphite-epoxy. The specific material for backpan 200 should be chosen to meet the desired design criteria, such as structural, thermal, weight, and environmental resistance requirements. For sheet metal, backpan 200 may be fabricated by processes such as stamping and stretch-forming. Backpan 200 may also be formed by casting or molding. Backpan 200 may also be formed with variable thickness rather than a constant wall thickness. Forming a backpan 200 with increased thickness in targeted areas, such as at the bottoms of depressions 230, may provide advantages including additional structural strength or higher thermal dissipation while reducing the weight compared to a backpan 200 having a uniform, higher wall thickness throughout.

Each of the depressions 230 provides a mounting space for a solar concentrator unit, not shown. The depressions 230 of FIG. 2 are configured as bowl-shaped wells to accommodate, for example, a concave mirror of a solar concentrator. However, depressions 230 may take the form of other shapes as appropriate for a particular solar concentrator design, such as squares or hexagons. The combination of depressions 230 and connecting troughs 240 creates a structure with improved stiffness compared to a flat design, with minimal deflection across the bottom surface 220 when loaded. This allows backpan 200 to be made of a thinner material than a comparable flat design, thus reducing weight and cost. For instance, a contoured backpan 200 may reduce the required thickness of an aluminum sheet by approximately 20% compared to the flat design of backpan 110 of FIG. 1. Reducing the material thickness, and thus the amount of raw material, directly decreases the cost of building a solar concentrator system. In addition, a lighter weight solar module decreases the load on a tracker frame and system, which allows for the use of lower cost tracker components.

The non-planar backpan 200 of FIG. 2 also eliminates the need for crossbars 120, thus eliminating the multiple number of parts and joining steps required to fabricate backpan assembly 100. The elimination of fasteners and associated mounting holes required to attach crossbars 120 also improves the weather resistance of backpan 200. Note that while backpan 200 is depicted with depressions 230 arranged as an array of four rows and five columns, other arrangements are possible as determined by factors such as the desired installation space and overall weight of the finished solar energy system.

Figure 3:
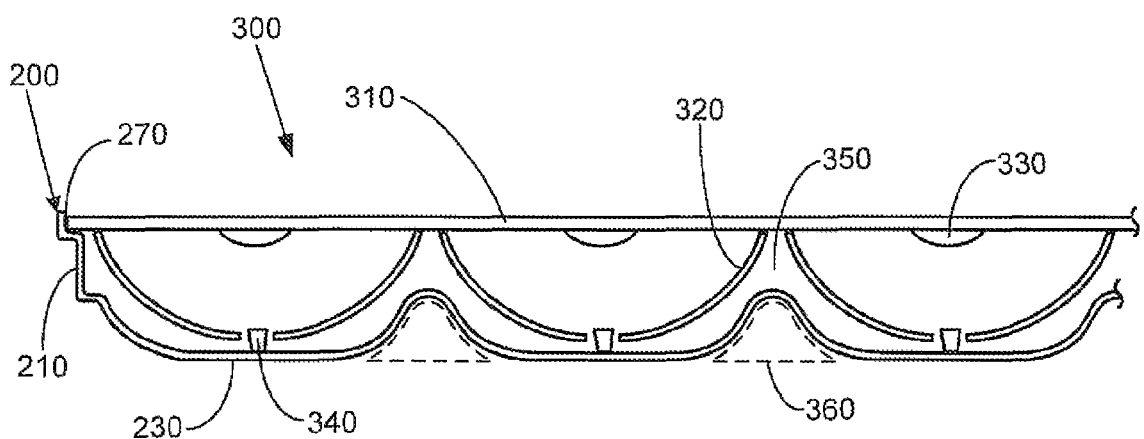
FIG. 3 shows a cross-sectional view of solar concentrator units mounted in the backpan of FIG. 2.

Additional advantages of the contoured design of backpan 200 are provided in the cross-sectional view of FIG. 3. FIG. 3 shows a finished solar concentrator array 300 with exemplary solar concentrator components mounted inside. Solar concentrator components of FIG. 3 include a front panel 310, primary mirrors 320, secondary mirrors 330, and photovoltaic receivers 340. Solar radiation enters front panel 310 and reflects off of primary mirror 320 to secondary mirror 330. Secondary mirror 330 further concentrates the radiation and reflects it to photovoltaic receiver 340 for conversion to electricity. The various solar concentrator components may be secured to depressions 230 using, for example, welding, adhesives and mechanical fasteners. Depressions 230 may also incorporate indentations or other features for attaching or aligning solar concentrator components. Although not shown in FIG. 3, the troughs 240 of FIG. 2 may act as wire guides for electrical leads connecting photovoltaic receivers 340. An optional lip 270 at the top edge of side walls 210 can provide support for and facilitate alignment of front panel 310. Alternatively, if lip 270 is not present, front panel 310 may be positioned onto side wall 210 with methods including, but not limited to, brackets, or grooves formed in the bottom face of front panel 310.

The curvature of primary mirrors 320 and secondary mirrors 330 results in an air space 350 within the solar concentrator array 300. Air contained within air space 350 can present reliability issues for solar concentrator array 300. For instance, solar concentrator array 300 typically includes a venting system to alleviate increased air pressure when the air space 350 becomes heated during operation of solar concentrator array 300. The greater the air space 350, the greater the importance of such a venting system to function properly. Similarly, air space 350 can accumulate moisture from the outside environment, which can affect the functionality of the various optical elements. Because solar concentrator systems focus light onto a small area, even a slight deviation in optical accuracy can greatly affect the efficiency of the system. Moisture within a solar collector can result in other problems, such as diffusion into semiconductor devices, degradation of certain coatings, and corrosion of electrical leads and other metal parts. Thus, it is highly desirable to minimize the amount of air space 350 within a solar concentrator array 300. Backpan 200 advantageously reduces the air space 350 due to the depressions 230 being contoured to match the shape of primary mirrors 320. The amount of air space which is reduced by backpan 200, compared to a flat backpan, is represented by dashed lines 360.

Another benefit of the present invention is that the increased surface area provided by depressions 230 improves thermal cooling of photovoltaic receivers 340 when backpan 200 is used as a heat sink. For example, in one embodiment, photovoltaic receivers 340 are thermally coupled to an aluminum backpan 200 such that backpan 200 conducts heat away from photovoltaic receivers 340. Additionally, radiative cooling by backpan 200 may be improved since the depressions 230 have surfaces which point in multiple directions. This allows heat to radiate in different directions, possibly towards a cooler object than that which may be directly behind (normal to the flat surface of) backpan 200.

Figure 4:
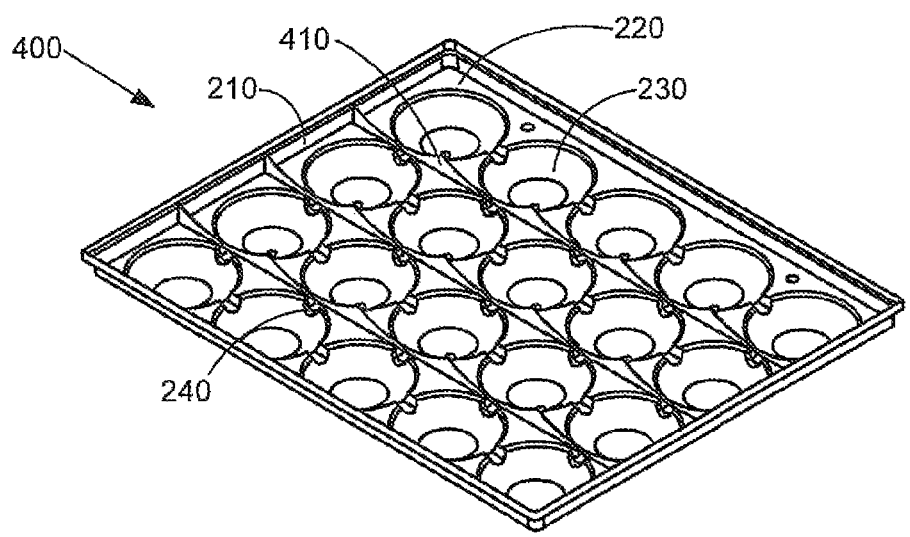
FIG. 4 illustrates the backpan of FIG. 2 with stiffening members.

FIG. 4 provides another embodiment of the present invention. In this perspective view, the backpan 200 incorporates stiffening members 410. In FIG. 4, stiffening members 410 are embodied as ribs inserted lengthwise across backpan 200 and attached to side walls 210 and bottom surface 220. Stiffening members 410 can provide additional structural stability to backpan 200, and also may act as supports for a front panel Thus, stiffening members 410 can be used to replace spacing rods 250 of FIG. 2 and further reduce the number of parts for a solar concentrator assembly. Because backpan 200 already has inherent structural integrity from depressions 230 and troughs 240, stiffening members 410 need not be made from a high-strength material, or may be eliminated entirely. For instance, stiffening members 410 and backpan 200 may both be fabricated from aluminum, which allows stiffening members 410 to be welded to backpan 200 without the use of fasteners. Alternatively, stiffening members 410 may be attached to backpan 200 with rivets, screws, bolts, or the like. Note that while stiffening members 410 in FIG. 4 are positioned to be parallel to each other, other configurations are possible. For instance, stiffening members 410 maybe arranged orthogonally to intersect with each other, such as with interlocking slots. Electrical leads may be routed under stiffening members 410, through troughs 240, as described previously.

Figure 5:
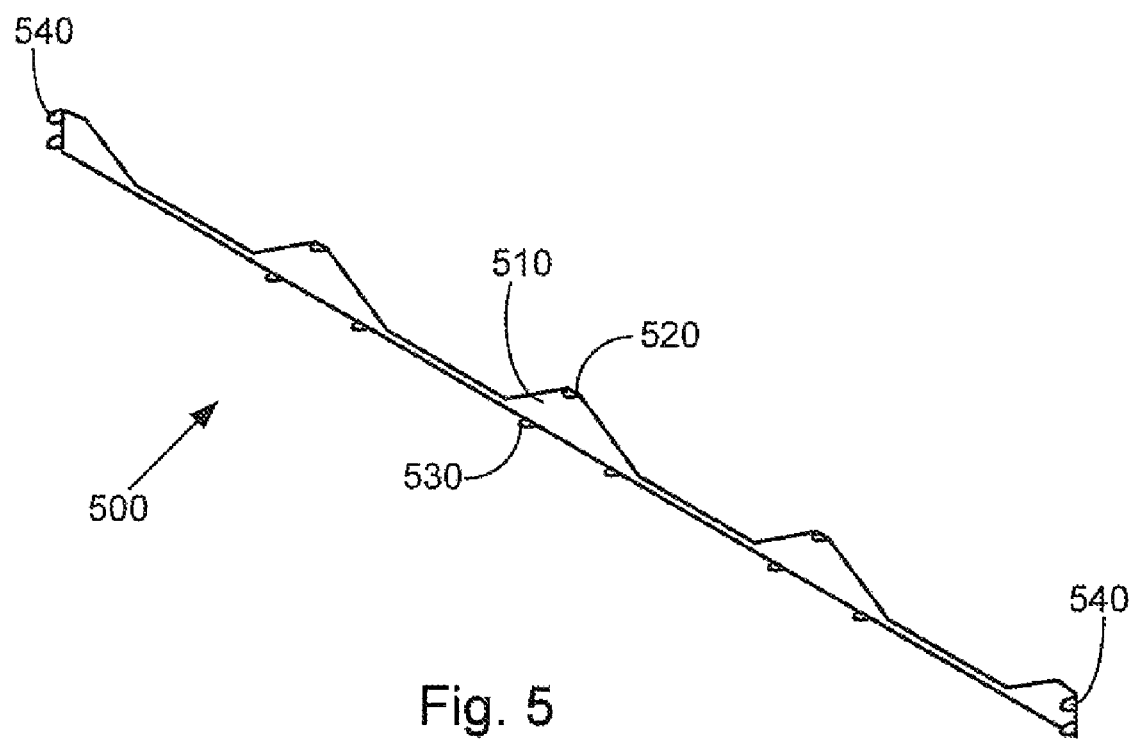
FIG. 5 provides a perspective view of an exemplary stiffening member.

A close-up view of an exemplary stiffening member 500 is given in FIG. 5. In this embodiment, stiffening member 500 is a sheet metal rib and includes trusses 510, upper tabs 520, lower tabs 530, and end tabs 540. Trusses 510 with upper tabs 520 provide support for a front panel, while lower tabs 530 and end tabs 540 provide stability and attachment points for stiffening member 410. All of the trusses 510 may be of the same height to support a planar front panel, or they may have differing heights such as to support a curved front panel. While trusses 510 are shown in FIG. 5 as triangular, they may also take the form of inverted arches as depicted in the stiffening members 410 of FIG. 4, or other shapes as desired. Furthermore, stiffening member 500 may include additional tabs, slots, holes, or other features as desired to align, attach or support various components of a solar concentrator.

Stiffening member 500 may be formed using standard sheet metal processes known in the art. Sheet metal forming enables stiffening member 500 to be a single part incorporating custom shapes and features as described in relation to FIG. 5. In other embodiments, stiffening member 500 may be, for example, a molded composite material, an extruded metal rod or beam, or a combination of more than one pieces assembled together. In another aspect, not all stiffening members 500 are required to be identical within a solar concentrator array. For example, one stiffening member may have reinforced trusses to provide additional support in the center region of a front panel. In another example, a particular stiffening member may have cut-outs or tabs in order to accommodate the presence of additional components in a selected region of the array. This may occur, for instance, with components involved with mounting the array to a tracking system, or parts associated with an electrical junction box for the array.

Figure 6:
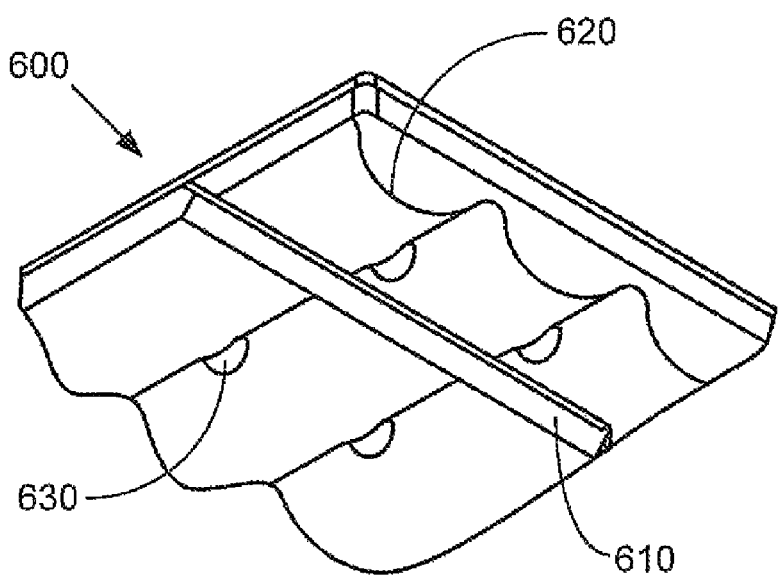
FIG. 6 is a partial perspective view of another embodiment of a backpan of the present invention.

In a yet further embodiment of the present invention, FIG. 6 illustrates a partial perspective view of a backpan 600 having a beam-type stiffening member 610 and linear depressions 620. Linear depressions 620, instead of the circular depressions described previously, may provide advantages for certain solar concentrator designs. For instance, linear depressions 620 may be used to accommodate parabolic trough mirrors, may allow for flexible positioning of individual concentrator units within backpan 600, or may simplify the tooling required to form a contoured backpan. Troughs 630 connect linear depressions 620 as described in previous embodiments. Stiffening member 610 is a beam of uniform height along its entire length, and may be formed by, for example, extrusion or by sheet metal bending. As described previously, stiffening member 610 contributes additional rigidity to backpan 600 and can provide support for a front panel to be mounted onto backpan 600.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention. Thus, it is intended that the present subject matter covers such modifications and variations as come within the scope of the appended claims and their equivalents.

What is claimed is:

1. A solar concentrator array, comprising:
    a backpan comprising side walls, a bottom surface, a plurality of depressions integrally formed in said bottom surface, and a plurality of troughs integrally formed in said bottom surface;
    a plurality of solar concentrator units, each of said solar concentrator units comprising an optical assembly and a photovoltaic receiver;
    a front panel covering said plurality of solar concentrator units;
    leads electrically coupling said photovoltaic receivers;
    wherein said plurality of troughs connect said plurality of depressions, and wherein said leads are routed through said troughs; and
    wherein said plurality of solar concentrator units are seated in said plurality of depressions.

2. The solar concentrator array of claim 1, wherein said depressions are substantially circular.

3. The solar concentrator array of claim 1, wherein said backpan further comprises a lip around the perimeter of said backpan, and wherein said lip is configured to support said front panel.

4. The solar concentrator array of claim 1, wherein said backpan has a length and a width, and wherein said length and said width define an area greater than one square meter.

5. The solar concentrator array of claim 1, wherein said optical assembly comprises a primary mirror and a secondary mirror, and wherein said secondary mirror is mounted to said front panel and is positioned to reflect light from said primary mirror to said photovoltaic receiver.

6. The solar concentrator array of claim 1, wherein said optical assembly comprises a primary mirror, a secondary mirror, and a space between said primary mirror and said secondary mirror, and wherein said space includes a dielectric.

7. The solar concentrator array of claim 1, wherein said backpan is made of aluminum.

8. The solar concentrator array of claim 1, wherein said backpan serves as a heat sink for said plurality of solar concentrator units.

9. The solar concentrator array of claim 1, further comprising a stiffening member attached to said side walls and to said bottom surface of said backpan.

10. The solar concentrator array of claim 9, wherein said stiffening member supports said front panel.

11. The solar concentrator array of claim 9, wherein said backpan and said stiffening member are both made of aluminum.

12. The solar concentrator array of claim 1, wherein said stiffening member has a height sufficient to support said front panel.

13. A method of manufacturing a solar concentrator array, said method comprising:
    loading a plurality of solar concentrator units into a backpan, wherein each of said solar concentrator unit comprises an optical assembly and a photovoltaic receiver, and wherein said backpan comprises side walls, a bottom surface, a plurality of depressions integrally formed in said bottom surface, and a plurality of troughs integrally formed in said bottom surface and connecting said plurality of depressions seating said plurality of solar concentrators units in said plurality of depressions;
    attaching electrical leads to said photovoltaic receivers, wherein said electrical leads couple said photovoltaic receivers;
    routing said electrical leads through said troughs;
    covering said plurality of solar concentrator units with a front panel; and
    securing said front panel to said side walls of said backpan.

14. The method of manufacturing a solar concentrator array of claim 13, further comprising the step of inserting stiffening members between said backpan and said front panel.

15. The method of manufacturing a solar concentrator array of claim 13, wherein said optical assembly comprises a primary mirror and a secondary mirror, and wherein said secondary mirror is coupled to said front panel and is positioned to reflect light from said primary mirror to said photovoltaic receiver.

16. The method of manufacturing a solar concentrator array of claim 13, further comprising the step of placing said photovoltaic receivers in a thermally conductive relationship with said backpan.

* * * * *